United States Patent
Casagrande et al.

(10) Patent No.: US 12,341,547 B2
(45) Date of Patent: Jun. 24, 2025

(54) SUPER-REGENERATIVE RECEIVER AND CORRECTION METHOD THEREOF

(71) Applicant: The Swatch Group Research and Development Ltd, Marin (CH)

(72) Inventors: Arnaud Casagrande, Bole (CH); Jean-Luc Arend, Corcelles (CH)

(73) Assignee: The Swatch Group Research and Development Ltd, Marin (CH)

( * ) Notice: Subject to any disclaimer, the term of this patent is extended or adjusted under 35 U.S.C. 154(b) by 338 days.

(21) Appl. No.: 17/857,658

(22) Filed: Jul. 5, 2022

(65) Prior Publication Data

US 2023/0101719 A1  Mar. 30, 2023

(30) Foreign Application Priority Data

Sep. 30, 2021 (EP) .................................... 21200074

(51) Int. Cl.
- *H04B 1/16* (2006.01)
- *H03D 11/02* (2006.01)
- *H04B 1/26* (2006.01)

(52) U.S. Cl.
CPC .............. *H04B 1/163* (2013.01); *H03D 11/02* (2013.01); *H04B 1/26* (2013.01)

(58) Field of Classification Search
CPC .......... H04B 1/163; H04B 1/26; H03D 11/02; H03D 11/08; H03D 11/04
See application file for complete search history.

(56) References Cited

U.S. PATENT DOCUMENTS

| | | | |
|---|---|---|---|
| 5,105,162 A | 4/1992 | Fleissner et al. | |
| 6,389,275 B1* | 5/2002 | Kawashima | H03D 11/04 455/215 |
| 9,900,197 B1 | 2/2018 | Rada et al. | |
| 2010/0237935 A1 | 9/2010 | Brown | |
| 2012/0214434 A1* | 8/2012 | Otaka | H04W 52/0229 455/256 |

FOREIGN PATENT DOCUMENTS

| | | |
|---|---|---|
| EP | 0969592 A1 | 1/2000 |
| JP | 5-191311 A | 7/1993 |
| JP | WO2011/077481 A1 | 6/2011 |

OTHER PUBLICATIONS

European Search Report for 21200074 dated Mar. 14, 2022.

* cited by examiner

*Primary Examiner* — Nader Bolourchi
(74) *Attorney, Agent, or Firm* — Sughrue Mion, PLLC

(57) ABSTRACT

A correction method for a super-regenerative receiver being configured to resonate at at least one oscillator resonant frequency reference value and comprising at least one control stage, at least one varactor, at least one reference system and, at least one oscillator. The method includes at least one setup of at least one reference signal value by the at least one reference system, at least one comparison of at least one oscillator frequency actual value of the at least one oscillator with the at least one reference signal value by the at least one reference system and at least one adjustment of at least one gain of the at least one control stage.

19 Claims, 3 Drawing Sheets

SUPER-REGENERATIVE RECEIVER AND CORRECTION METHOD THEREOF

CROSS REFERENCE TO RELATED APPLICATION

The present application is based on, and claims priority from the prior European Patent Application No. 21200074.9, filed on Sep. 30, 2021, the entire contents of which are incorporated herein by reference.

TECHNICAL FIELD

The following invention relates to a super-regenerative receiver apparatus and to a controlling resonant frequency method.

STATE OF THE ART

A voltage-controlled oscillator, VCO for short, is an oscillator whose frequency is determined by a control voltage. Typically, VCO needs a minimum current to start the oscillation and the oscillator is regularly started-up by applying an increasing current and turned off again. In others words, this current variation lets the oscillation signal start with an amplitude rising slowly until it hits a maximum and then falls back to a non-oscillating state: this increasing current scheme is called quench phase.

A radiofrequency signal, RF signal for short, is directly injected to the oscillator. According to the presence or not of a RF signal at the resonance frequency, or very close, of the oscillator and according to the amplitude of the RF signal, the oscillator starts-up more or less rapidly. The start-up timing is measured and this measurement directly corresponds to AM or FM modulated signal. The selectivity of this system is very good, because the close to oscillation coil gets an enhanced equivalent quality factor, due to the active negative resistance provided by the oscillator.

However, the resonant frequency of the coil is generally modified during the increasing phase of the bias current. This modification is due to two different phenomenon. On one hand, the inductor circuit equivalent model gets a serial resistor, which represents rolled into one its metal resistance, the skin effect and the Eddy currents losses within the substrate. When this inductor is operated in parallel with the negative resistance of the active circuit, the equivalent parallel inductor value is modified and multiplied by $(1+1/Q^2)$, where Q is the global quality factor of the coil. Then, sweeping the bias current of the oscillator slightly shifts the resonant frequency. On the other hand, depending on the bias current, the internal oscillator nodes get variations on their bias voltages, which modifies the equivalent total tank capacitance and modifies the global resonant frequency.

SUMMARY OF THE INVENTION

One of the objective of the present invention is to provide a correction of this frequency drift during the quench phase. The frequency correction can be done, advantageously, by using a Voltage Control Oscillator bias current dependent varactor, which can be calibrated at various points of a previously measured bias current to open loop frequency characteristic, such as to reduce the difference between the oscillator frequency actual value and the oscillator resonant frequency reference value, between 0.99 and 1.01.

For this purpose, the PLL loop voltage at a given VCO current bias is memorized, and the same loop voltage at another VCO current bias is achieved. This calibration can be done on multiple VCO bias points within the PLL function range, and the corresponding corrections can be digitally stored in a lookup table. In calibrated and corrected operation, each time the quench bias is provided to the VCO, the pre-calibrated voltages stored into the lookup are sent to the VCO correction varactor in function of the bias current.

This is achieved by a correction method according to claim 1 and a super-regenerative receiver according to claim 11.

BRIEF DESCRIPTION OF THE DRAWINGS

The foregoing and other purposes, features, aspects and advantages of the invention will become apparent from the following detailed description of the embodiments, given by way of illustration and not limitation with reference to the accompanying drawings, in, which.

DESCRIPTION OF THE INVENTION

Figure 1:
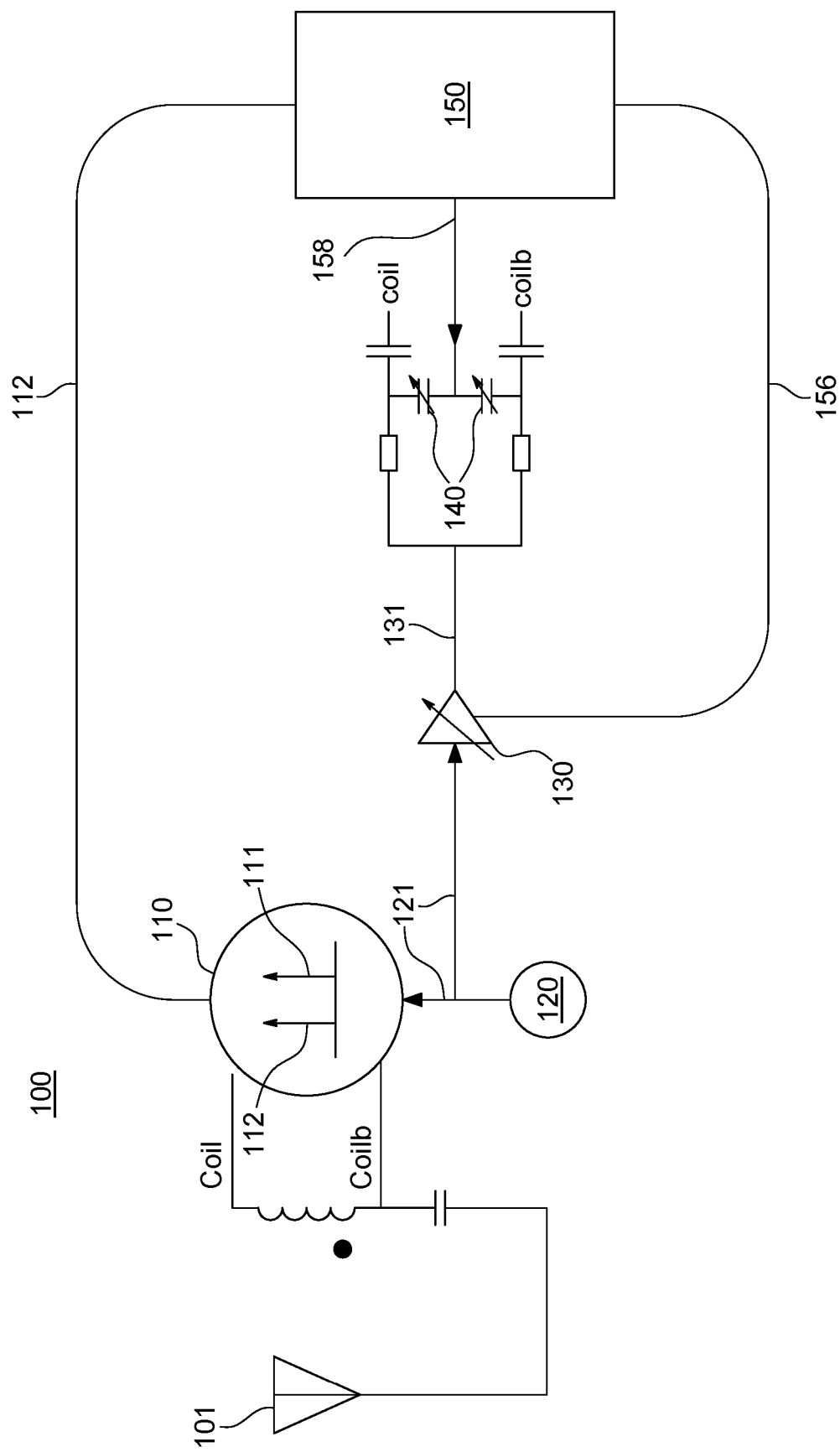
FIG. 1 represents a simplified version of a super-regenerative receiver 100 according to an aspect of the invention.
Figure 3:
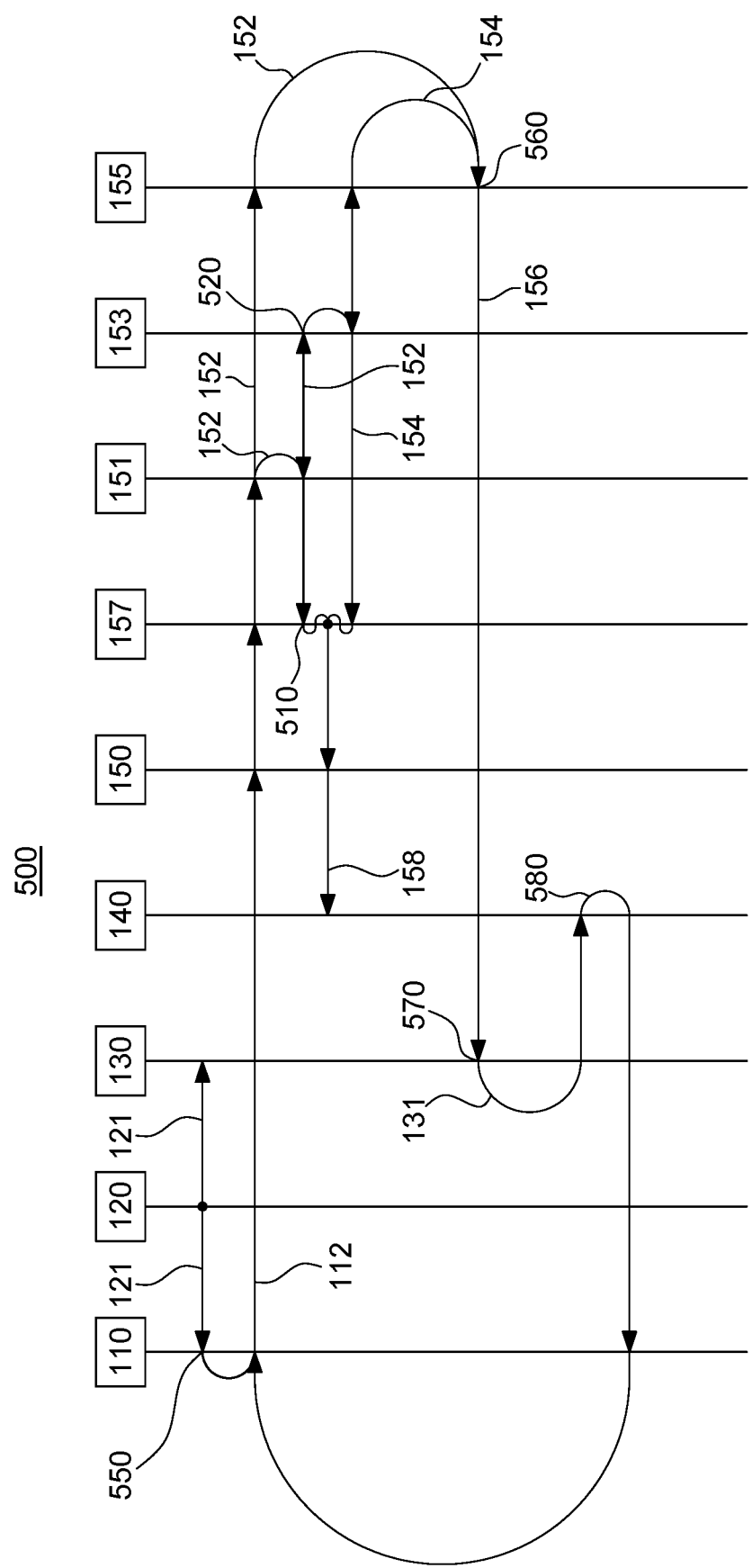

The present invention relates to a super-regenerative receiver 100 implementing a correction method 500 represented in FIG. 3. As shown in FIG. 1, said super-regenerative receiver 100 comprises at least one oscillator 110, at least one varactor 140, at least one control stage 130, and at least one reference system 150.

Said at least one oscillator 110 is connected to an antenna 101. Said antenna 101 is configured to receive radio frequency signal, RF signal for short. This RF signal is directed to said at least one oscillator 110, which is typically a voltage-controlled oscillator whose frequency is determined by a control voltage.

Said super-regenerative receiver 100 comprises at least one bias control signal generator 120, as illustrated in FIG. 1. Said at least one bias control signal generator 120 generates at least one bias control signal 121, a sawtooth current signal for example, and also modifies 550 said oscillator's transconductance, which causes the oscillation signal to start and its corresponding amplitude to rise until it hits a maximum and then falls back to a non-oscillating state: this increasing current scheme is called quench phase.

During said quench phase, one of the adverse effect is the modification of the oscillation frequency, which leads to a combination of different side effects like the change of the parallel inductance for example, the modification of the non-linear capacitance of the transistor's junction according its operating point for instance, and, in some cases, the frequency variation may be positive or negative. In order to reduce the drift between the oscillator frequency actual value and the oscillator resonant frequency reference value, around 0.99 and 1.01, said correction method 500 may provide, advantageously, a correction of this frequency drift during the quench phase.

Figure 2:
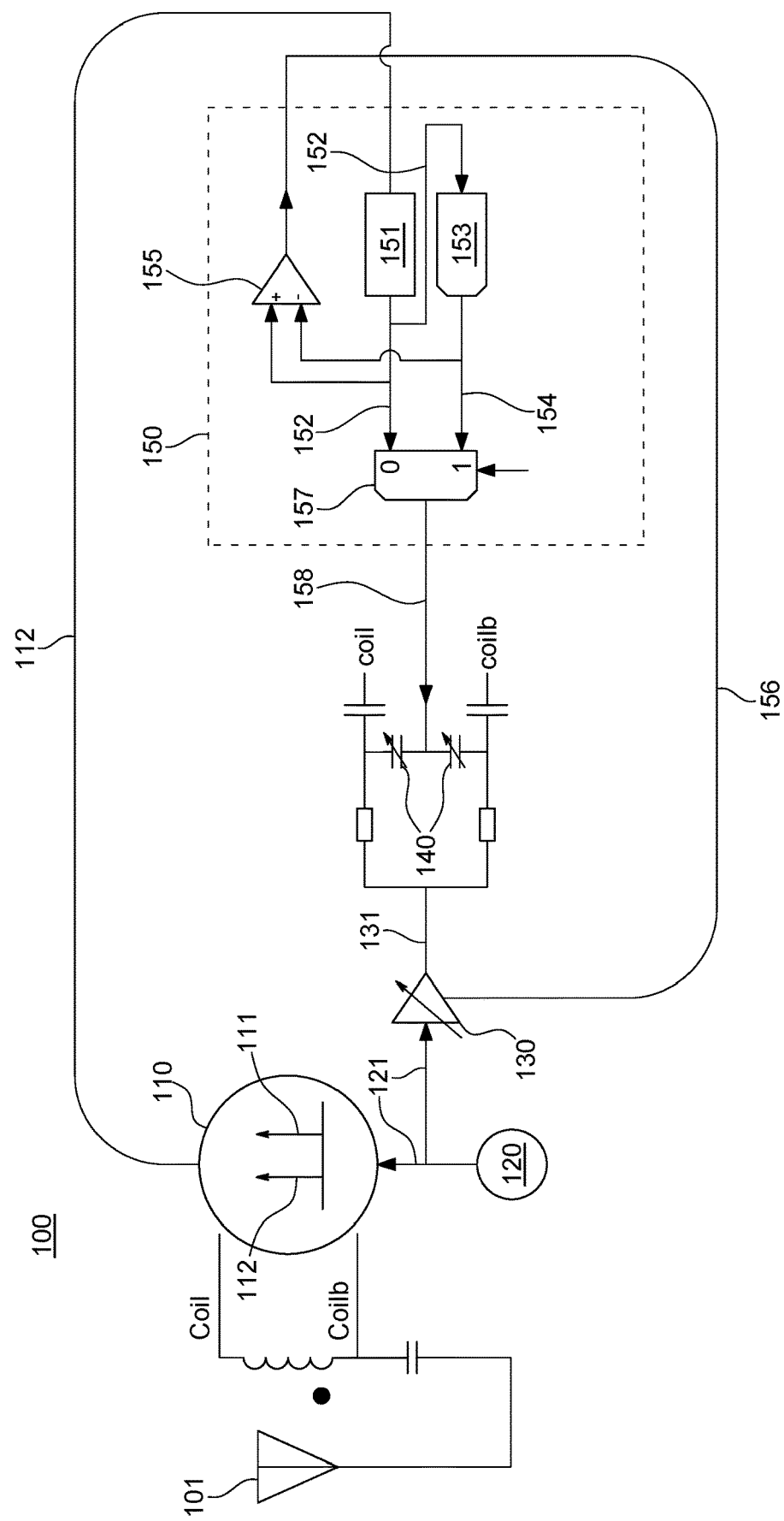
FIG. 2 illustrates a detailed version of said super-regenerative receiver 100 according to an aspect of the invention; and, FIG. 3 shows a correction method 500 implemented by said super-regenerative receiver 100 according to an aspect of the invention.

For convenience, only the positive frequency variation is depicted in FIGS. 1 and 2, however, said correction method 500 acts also on the negative frequency variation.

As mentioned, said at least one bias control signal generator 120 generates said at least one bias control signal 121, which evolves as a function of time, such as to initiate the oscillation of said at least one oscillator 110. As observed in FIG. 1, said at least one control stage 130 is directly connected to said at least one bias control signal generator 120 and said at least one bias control signal generator 120 supplies said at least one control stage 130 with a copy of said at least one bias control signal 121.

During the quench phase, said at least one oscillator 110 oscillates at least one oscillator frequency actual value 112 and, i.e. said at least one oscillator frequency actual value 112 rises, when said at least one oscillator 110 achieves at least one oscillator resonant frequency reference value 111, which may be 2.4 GHz, said at least one oscillator 110 resonates.

Said at least one reference system 150 comprises at least one control system 151, as depicted in FIG. 2. Said at least one control system 151 is configured to sense said at least one oscillator frequency actual value 112 from said at least one oscillator 110, and at least one setup 510 of said correction method 500 establishes said at least one reference signal value 158. In other words, said at least one control system 151 provides at least one frequency actual value 152 as a function of said at least one oscillator frequency actual value 112 and sets up 510 said at least one frequency actual value 152 as said at least one reference signal value 158, as illustrated in FIG. 3. In other words, said at least one control system 151, which may be an at least one phase-locked loop, may be configured to generate said at least one frequency actual value 152 whose phase is related to the phase of at least one frequency actual value 152. Indeed, since said at least one oscillator frequency actual value 112 drifts away from said at least one oscillator resonant frequency reference value 111, one of the advantage of said correction method 500 is to correct this frequency drift during the quench phase, such as to reduce the ratio between said at least one oscillator frequency actual value 112 and said at least one oscillator resonant frequency reference value 111 between 0.99 and 1.01.

Said at least one frequency actual value 152, rather said at least one reference signal value 158 is then applied on said at least one varactor 140. Thus, said at least one reference signal value 158 is used to set operating condition of said at least one varactor 140 according to said at least one oscillator resonant frequency reference value 111.

As shown in FIG. 2, said at least one reference system 150 comprises also at least one memory 153. Said at least one memory 153 approaches said at least one reference signal value 158 by approximating said at least one frequency actual value 152 per dichotomy and maintains said at least one frequency control signal value 154 as said at least one reference signal value 158 on said at least one varactor 140. As soon as said at least one frequency control signal value 154 has almost the same value as said at least one frequency actual value 152, in other words, as soon as said at least one frequency control signal value 154 memorizes or has approximated at least one frequency actual value 152, a switch 157, comprised by said at least one reference system 150, switches and so substitutes 520 said at least one frequency actual value 152 as said at least one reference signal value 158 for said at least one frequency control signal value 154 as said at least one reference signal value 158.

At the same time, at least one comparator 155, comprised by said at least one reference system 150, compares 560 said at least one frequency actual value 152 with said at least one frequency control signal value 154. Said at least one comparison 560 of at least one oscillator frequency actual value 112 of said at least one oscillator 110 with said at least one reference signal value 158 by said at least one reference system 150, rather the comparison's result is then transmitted to said at least one control stage 130 as at least one gain control signal 156 in order to adjust 570 at least one gain of said control stage 130. Indeed, said at least one comparator 155 generates said at least one gain control signal 156 as a function of the difference between said at least one frequency actual value 152 and said at least one frequency control signal value 154 as illustrated in FIG. 2. Said adjustment 570 may increase or decrease said at least one gain of said control stage 130 such as the variation of said at least one oscillator frequency actual value 112 may be positive or negative respectively.

As previously mentioned and illustrated in FIG. 2, said at least one control stage 130 receives, on one side, a copy of said at least one bias control signal 121 and, on the other side, said at least one gain control signal 156. Thus, said at least one gain control signal 156 adjusts 570 said at least one gain of said at least one control stage 130, and thus said at least one control stage 130 tunes 580 the capacity value of said at least one varactor 140, via at least one tuning frequency control signal 131, such as to reduce the ratio between said at least one oscillator frequency actual value 112 and said at least one oscillator resonant frequency reference value 111 between 0.99 and 1.01. Said at least one control stage 130 is configured to tune 580 the capacity value of said at least one varactor 140 despite said at least one reference signal value 158. In others words, since said at least one oscillator frequency actual value 112 drifts away from said at least one oscillator resonant frequency reference value 111, during said quench phase, said correction method 500 may correct this frequency drift by reducing the ratio between said at least one oscillator frequency actual value 112 and said at least one oscillator resonant frequency reference value 111 between 0.99 and 1.01.

As illustrated in FIG. 2, on one side, said at least one memory 153 provides said at least one varactor 140 with said at least one reference signal value 158 such as to set operating condition, and on the other side, said at least one tuning frequency control signal 131 acts on the capacity value of said at least one varactor 140. Thus, the tuning 580 of the capacity value of said at least one varactor 140 leads to a translation of said at least one oscillator frequency actual value 112 of said at least one oscillator 110 so close to said at least one oscillator resonant frequency reference value 111, such as the ratio between said at least one oscillator frequency actual value 112 and said at least one oscillator resonant frequency reference value 111 between 0.99 and 1.01.

Indeed, also early mentioned, during said quench phase, the change of the parallel inductance, the modification of the non-linear capacitance of the transistor's junction may lead to a positive or negative frequency variation, and said correction method 500 acts on the positive or negative frequency variation by reducing the ratio between said at least one oscillator frequency actual value 112 and said at least one oscillator resonant frequency reference value 111 between 0.99 and 1.01 and so by translating, i.e. by decreasing or increasing respectively said at least one oscillator frequency actual value 112 of said at least one oscillator 110 such as to get closer to said at least one oscillator resonant frequency reference value 111.

What is claimed is:

1. A correction method (500) for a super-regenerative receiver (100); said super-regenerative receiver (100) configured to resonate at at least one oscillator resonant frequency reference value (111) and having at least one control stage (130), and at least one varactor (140), and at least one reference system (150) and at least one oscillator (110) configured to oscillate at at least one oscillator frequency actual value (112); said correction method (500) comprising any one or more of (a), (b), (c), and (d), wherein (a) comprises setting (510) of at least one reference signal value (158), by said at least one reference system (150);

wherein (b) comprises comparing (560) of at least one frequency actual value (152) with at least one frequency control signal value (154) by said at least one reference system (150);

wherein (c) comprises adjusting (570) of at least one gain of said at least one control stage (130) by said at least one reference system (150) via at least one gain control signal (156); and wherein (d) comprises tuning (580) the capacity value of said at least one varactor (140) via at least one tuning frequency control signal (131); said at least one tuning frequency control signal (131) is configured to vary the capacity value of said at least one varactor (140) such as to reduce the ratio between said at least one oscillator frequency actual value (112) and said at least one oscillator resonant frequency reference value (111) between 0.99 and 1.01.

2. The correction method (500) according to claim 1, wherein said at least one reference system (150) comprises at least one control system (151); said at least one control system (151) senses said at least one oscillator frequency actual value (112) from said at least one oscillator (110) and provides said at least one frequency actual value (152) as a function of said at least one oscillator frequency actual value (112); said at least one control system (151) sets up (510) said at least one frequency actual value (152) as said at least one reference signal value (158).

3. The correction method (500) according to claim 2, wherein said at least one reference system (150) comprises at least one memory (153) and wherein said at least one setup (510) comprises at least one substitution (520) by said at least one memory (153) of said at least one frequency actual value (152) as said at least one reference signal value (158) for said at least one frequency control signal value (154) as said at least one reference signal value (158).

4. The correction method (500) according to claim 3, wherein said at least one substitution (520) of said at least one frequency actual value (152) for at least one frequency control signal value (154) comprises at least one approximation of said at least one frequency actual value (152) by said at least one frequency control signal value (154).

5. The correction method (500) according to claim 4, wherein said at least one approximation approaches said at least one frequency actual value (152) per dichotomy.

6. The correction method (500) according to claim 4, wherein said at least one substitution (520) comprises at least one maintain of said at least one frequency control signal value (154) as said at least one reference signal value (158) on said at least one varactor (140) via said at least one memory (153) after said at least one approximation is achieved.

7. The correction method (500) according to claim 1, wherein said at least one reference system (150) comprises at least one comparator (155); said at least one comparator (155) generates said at least one gain control signal (156) as a function of the difference between said at least one frequency actual value (152) and said at least one frequency control signal value (154).

8. The correction method (500) according to claim 1, wherein said super-regenerative receiver (100) comprises at least one bias control signal generator (120) configured to generate at least one bias control signal (121) as a function of time, and, which comprises at least one modification (550) of said oscillator's transconductance via at least one bias control signal (121).

9. The correction method (500) according to claim 8, wherein said at least one bias control signal (121) initiates a oscillation of said at least one oscillator (110) and supplies said at least one control stage (130).

10. The correction method (500) according to claim 1, wherein said at least one tuning (580) comprises a translation of said at least one oscillator frequency actual value (112) of said at least one oscillator (110) toward said at least one oscillator resonant frequency reference value (111).

11. A super-regenerative receiver (100) for implementing a correction method (500) according to claim 1; said super-regenerative receiver (100) being configured to resonate at an oscillator resonant frequency reference value (111) and comprising any one or more of (e), (f), (g), and (h), wherein (e) is an oscillator (110): said at least one oscillator (110) configured to oscillate by receiving at least one radio frequency signal;

wherein (f) is a varactor (140): said at least one varactor (140) configured to vary the oscillator frequency actual value (112);

wherein (g) is a control stage (130): said at least one control stage (130) configured to vary the capacity value of said at least one varactor (140);

wherein (h) is a reference system (150): said at least one reference system (150) configured to set up said at least one reference signal value (158) on said at least one varactor (140) and to adjust at least one gain of said control stage (130) such as to reduce the ratio between said at least one oscillator frequency actual value (112) and said at least one oscillator resonant frequency reference value (111) between 0.99 and 1.01.

12. The super-regenerative receiver (100) according to claim 11, wherein said at least one reference system (150) comprises at least one control system (151) configured to sense said at least one oscillator frequency actual value (112) from said at least one oscillator (110) and to provide at least one frequency actual value (152) as said at least one reference signal value (158).

13. The super-regenerative receiver (100) according to claim 12, wherein said at least one reference system (150) comprises at least one memory (153) configured to substitute said at least one frequency actual value (152) as said at least one reference signal value (158) for at least one frequency control signal value (154) as said at least one reference signal value (158) and to maintain said at least one reference signal value (158) on said at least one varactor (140).

14. The super-regenerative receiver (100) according to claim 13, wherein said at least one reference system (150) comprising at least one comparator (155) configured to compare (560) said at least one frequency actual value (152) with said at least one frequency control signal value (154).

15. The super-regenerative receiver (100) according to claim 11, which comprises at least one bias control signal generator (120) configured to generate at least one bias control signal (121) as a function of time such as to initiate the oscillation of said at least one oscillator (110) and to supply said at least one control stage (130).

16. The correction method (500) according to claim 1, wherein the method comprises at least two of (a), (b), (c), and (d).

17. The correction method (500) according to claim 1, wherein the method comprises at least three of (a), (b), (c), and (d).

18. The correction method (500) according to claim 1, wherein the method comprises each of (a), (b), (c), and (d).

19. The correction method (500) according to claim 1, wherein the characteristic is the capacity value.

* * * * *